United States Patent
Yoshinaga

(10) Patent No.: US 10,476,236 B2
(45) Date of Patent: Nov. 12, 2019

(54) QUANTUM CASCADE LASER, LIGHT EMITTING APPARATUS, METHOD FOR FABRICATING QUANTUM CASCADE LASER

(71) Applicant: SUMITOMO ELECTRIC INDUSTRIES, LTD., Osaka (JP)

(72) Inventor: Hiroyuki Yoshinaga, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/006,666

(22) Filed: Jun. 12, 2018

(65) Prior Publication Data
US 2018/0366910 A1   Dec. 20, 2018

(30) Foreign Application Priority Data
Jun. 19, 2017 (JP) .................... 2017-119598

(51) Int. Cl.
*H01S 5/34*   (2006.01)
*H01S 5/028*   (2006.01)
(Continued)

(52) U.S. Cl.
CPC .......... *H01S 5/3402* (2013.01); *H01S 5/0207* (2013.01); *H01S 5/028* (2013.01);
(Continued)

(58) Field of Classification Search
CPC ....... H01S 5/3401–5/3402; H01S 5/16–5/168; H01S 5/028–5/0288; H01S 5/22–5/24;
(Continued)

(56) References Cited

U.S. PATENT DOCUMENTS 4,751,710 A * 6/1988 Yamaguchi ........... H01S 5/0264
                                                 372/44.01
5,180,685 A * 1/1993 Yamamoto ......... H01L 33/0062
                                                 148/DIG. 72
(Continued)

FOREIGN PATENT DOCUMENTS

DE    102008045980         6/2010
DE    102008045980 A1 *   6/2010   ............. B82Y 20/00
(Continued)

OTHER PUBLICATIONS

Manijeh Razeghi, "High-Performance InP-Based Mid-IR Quantum Cascade Letters", *IEEE Journal of Selected Tops in Quantum Electronics*, vol. 15, No. 3, p. 941-p. 951, May/Jun. 2009.
(Continued)

*Primary Examiner* — Joshua King
(74) *Attorney, Agent, or Firm* — Smith, Gambrell & Russell, LLP.

(57) ABSTRACT

A quantum cascade laser comprises: a laser structure including a first region, a second region, and a third region, the first region having an end face; a high-specific resistance region disposed on the first and second regions; a metal layer disposed on the third region; a dielectric film disposed on the end face and the high-specific resistance region; and a reflective metal film disposed on the dielectric film, the end face and the high-specific resistance region. The first to third regions are arranged in order in a direction of a first axis. The laser structure has a terrace on a boundary between the second and third regions, and the laser structure includes a semiconductor mesa and a conductive base. The semiconductor mesa has a core layer, and the conductive base mounts the semiconductor mesa. The high-specific resistance region has a specific resistance larger than that of the conductive base.

6 Claims, 11 Drawing Sheets

(51) Int. Cl.
*H01S 5/022* (2006.01)
*H01S 5/22* (2006.01)
*H01S 5/02* (2006.01)
*H01S 5/042* (2006.01)
*H01S 5/343* (2006.01)
*H01S 5/12* (2006.01)
*H01S 5/227* (2006.01)

(52) U.S. Cl.
CPC .......... *H01S 5/0282* (2013.01); *H01S 5/0285* (2013.01); *H01S 5/02272* (2013.01); *H01S 5/22* (2013.01); *H01S 5/0202* (2013.01); *H01S 5/02276* (2013.01); *H01S 5/0421* (2013.01); *H01S 5/0425* (2013.01); *H01S 5/12* (2013.01); *H01S 5/2224* (2013.01); *H01S 5/2275* (2013.01); *H01S 5/3401* (2013.01); *H01S 5/34306* (2013.01); *H01S 2301/176* (2013.01)

(58) Field of Classification Search
CPC ............... H01S 5/0226; H01S 5/02272; H01S 5/02236–5/02276; H01S 5/02469; H01S 5/02484; H01S 5/02476; H01S 5/02492
See application file for complete search history.

(56) References Cited

U.S. PATENT DOCUMENTS

| | | | | |
|---|---|---|---|---|
| 5,677,922 | A * | 10/1997 | Hayafuji | B82Y 20/00 372/46.01 |
| 5,943,553 | A * | 8/1999 | Spaeth | H01L 33/641 372/107 |
| 6,289,030 | B1 * | 9/2001 | Charles | H01L 31/02161 257/437 |
| 6,326,646 | B1 * | 12/2001 | Baillargeon | B82Y 20/00 257/94 |
| 6,355,505 | B1 | 3/2002 | Maeda et al. | |
| 6,647,047 | B2 * | 11/2003 | Yokota | H01S 5/0281 372/49.01 |
| 6,710,375 | B2 | 3/2004 | Oshima | |
| 9,184,563 | B1 | 11/2015 | Raring et al. | |
| 2003/0035453 | A1 * | 2/2003 | Fitz | H01S 5/028 372/49.01 |
| 2004/0101013 | A1 * | 5/2004 | Yokota | H01S 5/028 372/46.013 |
| 2004/0233950 | A1 * | 11/2004 | Furukawa | H01S 5/028 372/43.01 |
| 2004/0238810 | A1 | 12/2004 | Dwilinski et al. | |
| 2005/0151150 | A1 * | 7/2005 | Choi | H01S 5/0425 257/99 |
| 2006/0239321 | A1 * | 10/2006 | Kume | B82Y 20/00 372/50.121 |
| 2006/0274804 | A1 * | 12/2006 | Behfar | H01S 5/028 372/49.01 |
| 2009/0067464 | A1 * | 3/2009 | Tanaka | B82Y 20/00 372/45.011 |
| 2009/0086782 | A1 | 4/2009 | Yokoyama et al. | |
| 2013/0028280 | A1 * | 1/2013 | Hongo | H01S 5/02461 372/44.01 |
| 2013/0107534 | A1 | 5/2013 | Avramescu et al. | |
| 2013/0250994 | A1 | 9/2013 | Moenster et al. | |
| 2013/0301666 | A1 | 11/2013 | Stagarescu et al. | |
| 2013/0322480 | A1 | 12/2013 | Edamura et al. | |
| 2014/0211819 | A1 | 7/2014 | Yoshida et al. | |
| 2014/0239250 | A1 * | 8/2014 | Fang | H01L 33/06 257/13 |
| 2015/0117484 | A1 | 4/2015 | Sugiyama et al. | |
| 2018/0069374 | A1 | 3/2018 | Kakuno et al. | |

FOREIGN PATENT DOCUMENTS

| | | | |
|---|---|---|---|
| DE | 102015116335 | 3/2017 | |
| DE | 102015116335 A1 * | 3/2017 | ........... H01S 5/0421 |

OTHER PUBLICATIONS

S.R. Darvish, et al., "High-power, continuous-wave operation of distributed-feedback quantum-cascade lasers at λ 7.8 μm", *Applied Physics Letters*, 89, 251119 2006.
Office Action for U.S. Appl. No. 16/011,818 dated Mar. 20, 2019.
Notice of Allowance for U.S. Appl. No. 16/011,869 dated May 6, 2019.
Notice of Allowance for U.S. Appl. No. 16/011,928 dated Apr. 8, 2019.
Notice of Allowance for U.S. Appl. No. 16/011,893 dated Apr. 8, 2019.

* cited by examiner

QUANTUM CASCADE LASER, LIGHT EMITTING APPARATUS, METHOD FOR FABRICATING QUANTUM CASCADE LASER

BACKGROUND OF THE INVENTION

Field of the Invention

The present invention relates to a quantum cascade laser, a light emitting apparatus, and a method for fabricating a semiconductor laser. This application claims the benefit of priority from Japanese Patent Application No. 2017-119598 filed on Jun. 19, 2017, which is herein incorporated by reference in its entirety.

Related Background Art

Manijeh Razeghi, "High-Performance InP-Based Mid-IR Quantum Cascade Lasers", IEEE JOURNAL OF SELECTED TOPICS IN QUANTUM ELECTRONICS, VOL. 5, NO. 3, MAY/JUNE 2009, referred to hereinafter as "Non-Patent Document 1" discloses a quantum cascade laser.

SUMMARY OF THE INVENTION

A quantum cascade laser according to one aspect of the present invention includes: a laser structure having a first region, a second region, and a third region, the first region having an end face; a high-specific resistance region disposed on the first region and the second region; a metal layer disposed on the third region; a dielectric film disposed on the end face and the high-specific resistance region; and a reflective metal film disposed on the dielectric film, the end face and the high-specific resistance region, the first region, the second region, and the third region being arranged in order in a direction of a first axis, the laser structure having a terrace with a difference in level disposed on a boundary between the second region and the third region, and the laser structure including a semiconductor mesa and a conductive base, the semiconductor mesa having a core layer, and the conductive base mounting the semiconductor mesa, and the high-specific resistance region having a specific resistance larger than that of the conductive base.

A light emitting apparatus according to another aspect of the present invention including: a quantum cascade laser having a laser structure with a first region with an end face, a second region, and a third region; a high-specific resistance region disposed on the first region and the second region; a metal layer disposed on the third region; a dielectric film disposed on the end face and the high-specific resistance region; and a reflective metal film disposed on the dielectric film, the end face and the high-specific resistance region; a supporting base mounting the quantum cascade laser; and a solder material making contact with the metal layer of the quantum cascade laser to fix the quantum cascade laser to the supporting base. The first region, the second region, and the third region are arranged in order in a direction of a first axis. The laser structure has a terrace on a boundary between the second region and the third region. The laser structure includes a semiconductor mesa and a conductive base. The semiconductor mesa has a core layer, and the conductive base mounts the semiconductor mesa, and the high-specific resistance region has a specific resistance larger than that of the conductive base.

A method for fabricating a quantum cascade laser according to still another aspect of the present invention includes: preparing a laser bar having an arrangement of device sections; supplying a flux of raw material for an dielectric insulator to a first end face of the laser bar to deposit dielectric insulator thereon; and after supplying the flux for the dielectric insulator, supplying a flux of raw material for a metal reflective film to the first end face of the laser bar to deposit the metal reflective film thereon. The laser bar includes a laser structure and a high-specific resistance region. The laser structure has a first region, a second region, a third region, and a terrace, and the first region having the first end face, and the high-specific resistance region are disposed on the first region. The first region, the second region, and the third region are arranged in order in a direction of a first axis and extending in a direction of a second axis intersecting that of the first axis. The high-specific resistance region extends in the direction of the second axis, and the terrace has a terrace with a difference in level extending on a boundary between the second region and the third region in the direction of the second axis.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Figure 1:
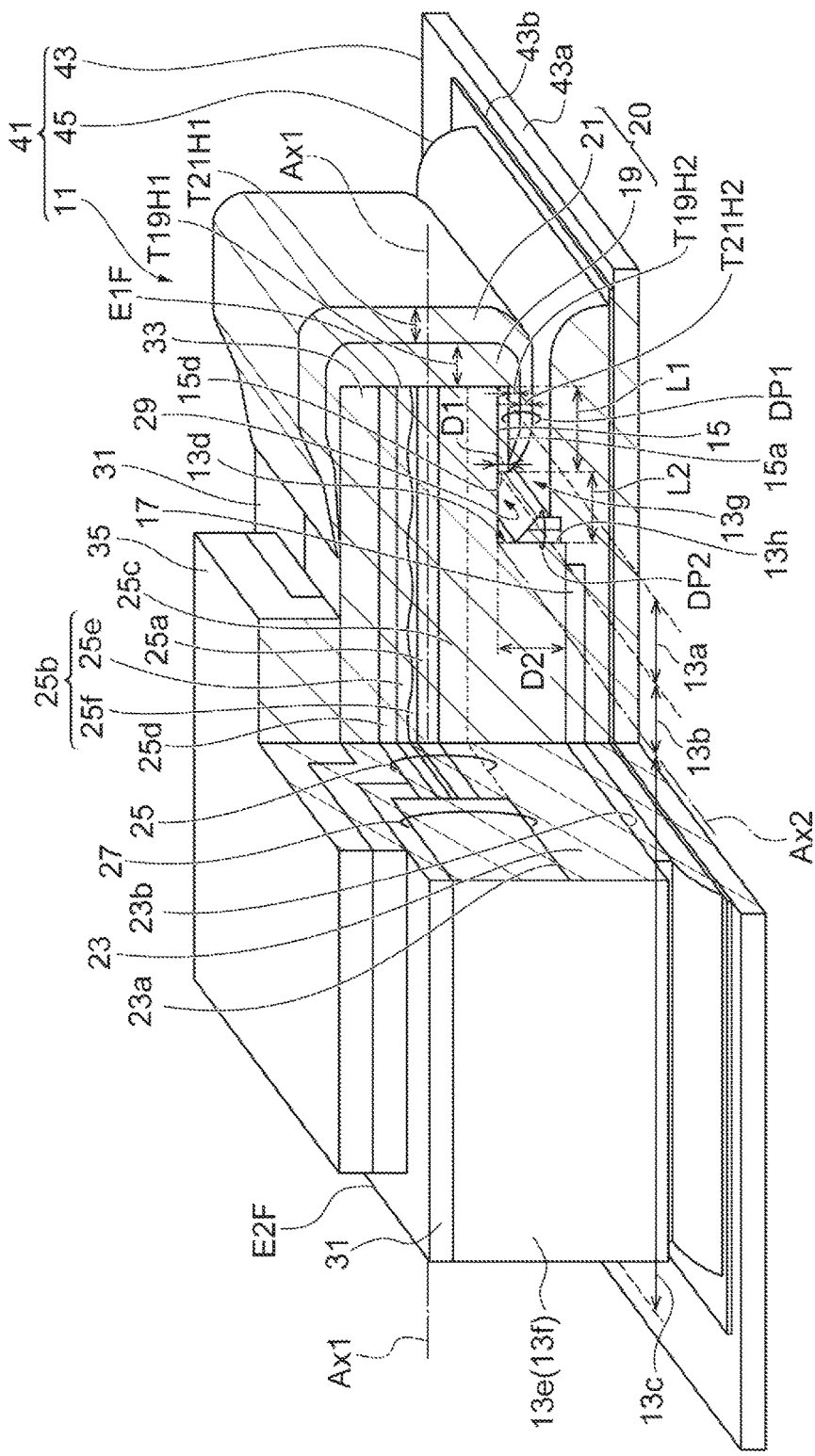
FIG. 1 is a partially cutaway schematic view showing a quantum cascade laser according to the present embodiment.

A quantum cascade laser may have a reflective film on an end face. The end face terminates multiple conductive semiconductor layers for the semiconductor laser, and is covered with the reflective film. The reflective film can include a metal film, which enables high reflectance. The metal film directly on the end face causes the conductive semiconductor layers to short-circuit at the end face. Growing a dielectric film on the end face and then growing the metal film thereon can avoid such a short circuit, and these growing processes form a composite film on the end face. In the composite film, the dielectric film underlies the metal film, and the underlying dielectric film can prevent the metal film from short-circuiting the conductive semiconductor layers at the end face. Such a composite film is provided by growing it on the end face of the laser bar. The inventor's findings reveal that some of quantum cascade lasers each of which has a composite film on the end face exhibit leakage current from the beginning and that others start to show an increasing leakage current during the operation. The inventor's observations show that short-circuiting may increase the leakage current in the quantum cascade laser.

It is an object of one aspect of the present invention to provide a quantum cascade laser having a structure that can avoid short-circuiting. It is an object of another aspect of the present invention to provide a light emitting apparatus including the quantum cascade laser. It is an object of still another aspect of the present invention to provide a method for fabricating a quantum cascade laser having a structure that can avoid short-circuiting.

Embodiments according to the above aspects will be described below.

A quantum cascade laser according to one embodiment includes: (a) a laser structure having a first region, a second region, and a third region, the first region having an end face; (b) a high-specific resistance region disposed on the first region and the second region; (c) a metal layer disposed on the third region; (d) a dielectric film disposed on the end face and the high-specific resistance region; and (e) a reflective metal film disposed on the dielectric film, the end face and the high-specific resistance region. The first region, the second region, and the third region are arranged in order in a direction of a first axis. The laser structure has a terrace with a difference in level disposed on a boundary between the second region and the third region. The laser structure includes a semiconductor mesa and a conductive base. The semiconductor mesa has a core layer, and the conductive base mounts the semiconductor mesa. The high-specific resistance region has a specific resistance larger than that of the conductive base.

The quantum cascade laser provides the end face of the laser structure with the dielectric film and the metal film. The order of processes for depositing the dielectric and metal reflective films allows the dielectric film to underlie the reflective metal film. The inventor's findings reveal that material for the dielectric film is deposited on the end face of the laser bar including an array of laser structures, and further flies along the sides of the laser bar in film formation to deposit on the high-specific resistance region on the first region, and that, similarly, material for the metal reflective film is deposited on the end face of the laser bar and flies along the sides of the laser bar in film formation to deposit on the high-specific resistance region. The inventor's observations reveal that the deposition of material for the dielectric film is, however, made thinner on the high-specific resistance region on the first region than on the end face of the laser structure. The high-specific resistance region on the laser structure makes it possible to separate the metal reflective film on the dielectric film from the semiconductor of the laser structure. The difference in level that the laser structure has can separate the metal reflective film on the high-specific resistance region from the metal layer.

In the quantum cascade laser according to an embodiment, the high-specific resistance region has an inorganic insulating film on the first region of the laser structure. The high-specific resistance region has an edge at a boundary between the second region and the third region, and the edge of the high-specific resistance region terminates the reflective metal film.

The quantum cascade laser allows the inorganic insulating layer to work as the high-specific resistance region. Causing the metal reflective film to terminate at the edge of the high-specific resistance region can space the metal reflective film from the semiconductor of the laser structure.

In the quantum cascade laser according to an embodiment, the inorganic insulating film includes a silicon-based inorganic insulator.

In the quantum cascade laser, the silicon-based inorganic insulator can provide the high-specific resistance region with a desired insulating property.

In the quantum cascade laser according to an embodiment, the laser structure includes an embedding region embedding the semiconductor mesa.

The quantum cascade laser can provide the end face of the buried structure thereof with the dielectric and metal reflective films.

A light emitting apparatus according to an embodiment includes: (a) a quantum cascade laser including: a laser structure having a first region, a second region, and a third region, the first region having an end face; a high-specific resistance region disposed on the first region and the second region; a metal layer disposed on the third region; a dielectric film disposed on the end face and the high-specific resistance region; and a reflective metal film disposed on the dielectric film, the end face and the high-specific resistance region; (b) a supporting base mounting the quantum cascade laser; and (c) a solder material making contact with the metal layer of the quantum cascade laser to fix the quantum cascade laser to the supporting base. The first region, the second region, and the third region are arranged in order in a direction of a first axis. The laser structure has a terrace with a difference in level on a boundary between the second region and the third region. The laser structure includes a semiconductor mesa and a conductive base. The semiconductor mesa has a core layer, and the conductive base mounts the semiconductor mesa, and the high-specific resistance region has a specific resistance larger than that of the conductive base.

The light emitting apparatus allows the quantum cascade laser to have the dielectric and metal films on the end face of the laser structure. The order of processes for forming the dielectric and metal reflective films allows the dielectric film to be under the reflective metal film. The inventor's findings reveal that material for the dielectric film is deposited on the end face of the laser bar including an array of laser structures, and further flies along the sides of the laser bar in film formation to deposit on the high-specific resistance region on the first region, and that material for the metal reflective film is, similarly, deposited on the end face of the laser bar and further flies along the sides of the laser bar in film formation to deposit on the high-specific resistance region. The inventor's observations show that the deposition of material for the dielectric film is, however, made thinner on the high-specific resistance region on the first region than the dielectric film on the end face of the laser structure. The high-specific resistance region on the laser structure makes it possible to separate the metal reflective film on the dielectric film from the semiconductor of the laser structure. The difference in level that the laser structure has can separate the metal reflective film on the high-specific resistance region from the metal layer.

A method for fabricating a quantum cascade laser according to an embodiment comprises: (a) preparing a laser bar having an arrangement of device sections; (b) supplying a flux of material for an dielectric insulator to a first end face of the laser bar to deposit dielectric insulator thereon; and (c) after supplying the flux of the dielectric insulator, supplying a flux of material for a metal reflective film to the first end face of the laser bar to deposit the metal reflective film thereon. The laser bar includes a laser structure and a high-specific resistance region. The laser structure has a first region, a second region, a third region, and a terrace. The first region has the first end face, and the high-specific resistance region is disposed on the first region. The first region, the second region, and the third region are arranged in order in a direction of a first axis and extend in a direction of a second axis intersecting that of the first axis. The high-specific resistance region extends in the direction of the second axis, and the terrace has a difference in level extending along a boundary between the second region and the third region in the direction of the second axis.

The method for fabricating the semiconductor laser forms the dielectric and metal films on the end face of the laser bar. Some of raw material for the dielectric film is deposited on the end face of the laser bar in the film formation, and others miss the end face to fly along the side faces of the laser bar and then deposit on the high-specific resistance region on the first region. Similarly, some of raw material for the metal reflective film also is deposited on the end face of the laser bar, and others miss the end face to fly along the side faces of the laser bar and then deposit on the high-specific resistance region on the first region. The order of processes for forming the dielectric and reflective metal films can place the reflective metal film on the dielectric film. The inventor's observations show that deposited material for the dielectric film on the top of the high-specific resistance region on the first region has a thickness smaller than that of the dielectric film on the end face of the laser bar. However, the high-specific resistance region provides the laser bar with a difference in level to ensure that the metal reflective film on the dielectric film is apart from the semiconductor of the laser structure. The laser bar is provided with the difference in level to separate the reflective metal film on the high-specific resistance region from the metal layer.

The teachings of the present invention can be readily understood by considering the following detailed description with reference to the accompanying drawings shown as examples. Referring to the accompanying drawings, embodiments according to a quantum cascade laser, a light emitting apparatus, and a method for fabricating quantum cascade laser will be illustrated below. When possible, the same portions will be denoted by the same reference numerals.

FIG. 1 is a partially cutaway schematic view showing a quantum cascade laser according to the present embodiment. The quantum cascade laser 11 includes a laser structure 13, a high-specific resistance region 15, a metal layer 17, a dielectric film 19, and a reflective metal film 21. The laser structure 13 has a first region 13a, a second region 13b and a third region 13c, which are sequentially arranged in the direction of the first axis Ax1. The first region 13a includes a first end face E1F, and the third region 13c includes a second end face E2F. The high-specific resistance region 15 is disposed on the first region 13a. The metal layer 17 is disposed on the third region 13c of the laser structure 13, and in the present embodiment, makes contact with the back face of the third region 13c. The dielectric film 19 is disposed on the first end face E1F and the high-specific resistance region 15, and the reflective metal film 21 is disposed on the first end face E1F, the high-specific resistance region 15, and the dielectric film 19. The laser structure 13 includes a conductive substrate and a semiconductor mesa 25, and the high-specific resistance region 15 has a specific resistance higher than that of the conductive substrate. The conductive substrate can be, for example, a semiconductor substrate 23. The semiconductor mesa 25 is mounted on the principal surface 23a of the semiconductor substrate 23. The semiconductor mesa 25 includes a core layer 25a and, specifically, further includes an upper semiconductor layer 25b, a lower semiconductor region 25c, and a contact layer 25d. The semiconductor mesa 25 extends in the direction of the first axis Ax1. In the present embodiment, the laser structure 13 further includes an embedding region 27, and the embedding region 27 embeds the semiconductor mesa 25. More specifically, the core layer 25a, the upper semiconductor layer 25b, the lower semiconductor region 25c, and the contact layer 25d and the embedding region 27 are arranged on the principal surface 23a. The semiconductor mesa 25 includes a first portion, a second portion, and a third portion, which are included in the first region 13a, the second region 13b, and the third region 13c, respectively. Likewise, the embedding region 27 also includes a first portion, a second portion, and a third portion, which are included in the first region 13a, the second region 13b, and the third region 13c, respectively.

The laser structure 13 has a terrace, which includes a stepped portion having a difference in level 13d at the boundary between the second and third regions 13b and 13c. The stepped portion of the laser structure 13 is disposed on the back face 23b (the surface opposite to the principal surface 23a) of the semiconductor substrate 23, and extends in a direction of a second axis Ax2 intersecting that of the first axis Ax1. The semiconductor substrate 23 includes a first portion, a second portion, and a third portion, which are included in the first region 13a, the second region 13b, and the third region 13c, respectively. The difference in level 13d is located at the boundary between the second and third portions of the semiconductor substrate 23, and the metal layer 17 is disposed on the third portion of the semiconductor substrate 23.

In the quantum cascade laser 11, the dielectric film 19 and the reflective metal film 21 are disposed on the first end face E1F of the laser structure 13. The order of processes for forming the dielectric film 19 and forming the reflective metal film 21 can place the dielectric film 19 under the reflective metal film 21. Studies conducted by the inventor reveal that a part of flux for the dielectric film 19 forms deposited material on the first end face E1F, and another part of this flux misses the first end face to fly along the sides of the laser bar (the top and bottom of the laser structure 13), thereby deposit on the high-specific resistance region 15 on the first region 13a. Likewise, a part of flux for the metal reflective film 21 forms deposited material on the first end face E1F as well as the sides of the laser bar (the top and the bottom faces of the laser structure 13) on the high-specific resistance region 15 on the first region 13a.

The inventor's observations show as follows: flux for the dielectric film 19 is also deposited on the semiconductor mesa 25 of the first region 13a; the material thus deposited has a thickness smaller than that of the dielectric film 19 on the first end face E1F; flux for the metal reflective film 21 is deposited on the semiconductor mesa 25 of the first region 13a; and the material thus deposited has a thickness smaller than that of the metal reflective film 21 on the first end face E1F.

The further inventor's observations show that the flux for the dielectric film 19 is deposited on the high-specific resistance region 15 on the first area 13a; the material thus deposited has a thickness smaller than that of the dielectric film 19 on the first end face E1F; flux for the reflective metal film 21 is deposited on the high-specific resistance region 15 on the first area 13a; and the material thus deposited has a thickness smaller than that of the reflective metal film 21 on the first end face E1F. The thickness of the material deposited on the high-specific resistance region 15 on the first region 13a is about 0.2 times as thick as that of the film on the first end face E1F. Specifically, the thickness T19H2 of the dielectric film 19 on the first face 15a of the high-specific resistance region 15 on the first region 13a is smaller than the thickness T19H1 of the dielectric film 19 on the first end face E1F, and the thickness T21H2 of the reflective metal film 21 on the first face 15a of the high-specific resistance region 15 on the first region 13a is smaller than the thickness T21H1 of the reflective metal film 21 on the first end face E1F. The high-specific resistance region 15 on the first region 13a can reliably separate the metal reflective film 21 on the dielectric film 19 from the semiconductor of the laser structure 13. The laser structure 13 is provided with the difference in level 13d, which can separate the reflective metal film 21 on the high-specific resistance region 15 from the metal layer. The high-specific resistance region 15 has a second face on the back side of the first face 15a, and the second face forms a junction with the first region 13a.

The quantum cascade laser 11 further includes a passivation film 31 disposed on the semiconductor mesa 25 and the embedding region 27, and an ohmic electrode 33 in contact with the top of the semiconductor mesa 25 through the opening of the passivation film 31. The ohmic electrode 33 is disposed on the first, second, and third regions 13a, 13b and 13c, and in the present embodiment, extends from the upper edge of the first end face E1F to the upper edge of the second end face E2F. On the third region 13c, the ohmic electrode 33 makes contact with a thick electrode 35 (plated electrode). If necessary, the thick electrode 35 can be spaced from the upper edge of the first end face E1F as in the present embodiment.

In the present embodiment, the laser structure 13 includes a terrace having the difference in level 13d extending from one of the sides 13e and 13f of the laser structure 13 to the other. In addition, the difference in level 13d forms a recess 13g with reference to the back face of the third region 13c on which the metal layer 17 extends, and the recess 13g is formed in the first and second regions 13a and 13b. In the recess 13g, the high-specific resistance region 15 extends from the lower edge of the first end face E1F in the direction of the first axis Ax1, and terminates at the boundary between the first and second regions 13a and 13b. The high-specific resistance region 15 covers the back face of the first region 13a, and does not cover the back face of the second region 13b. The high-specific resistance region 15 has a stepped portion 15d at the terminal end thereof with reference to the bottom face of the recess 13g. The recess 13g has a bottom face extending to the upper edge of the first end surface E1F. The high-specific resistance region 15 causes the dielectric film 19 and the reflective metal film 21 to terminate at the upper edge of the small stepped portion 15d, and prevents the dielectric film 19 and the reflective metal film 21 from extending on the second region 13b. The small step 15d shields fluxes for the dielectric and reflective metal films 19 and 21, which flow along the laser structure, to prevent the deposited materials of the dielectric and reflective metal films 19 and 21 from extending beyond the small step 15d. Fragments of the dielectric film 19 and the reflective metal film 21 may be provided on the side 13h of the step 13d. In addition, the difference in level 13d of the laser structure 13 shields fluxes for the dielectric and reflective metal films 19 and 21, which flow along the laser structure, to prevent the deposited materials DP2 of the dielectric and reflective metal films 19 and 21 from extending beyond the difference in level 13d. Fractions of the dielectric and reflective metal films 19 and 21 may be formed on the side of the difference in level 13d. The step 13d is larger than the small step 15d. The step 13d separates the metal layer 17, which makes contact with the back face of the semiconductor substrate 23, from the dielectric and reflective metal films 19 and 21 on the first region 13a. The high-specific resistance region 15 has an end portion (the difference in level 15d) apart from the step 13d. The second region 13b is made depressed with reference to the first face 15a of the high-specific resistance region 15, and forms a groove 29 between the third region 13c and the high-specific resistance region 15.

The high-specific resistance region 15 has an electrical conductivity smaller than that of semiconductor in the semiconductor mesa 25, and exhibits a high specific resistance. The high-specific resistance region 15 has an electrical conductivity smaller than that of the semiconductor of the semiconductor substrate 23 to enable high specific resistance. The high-specific resistance region 15 may include an inorganic insulating film, such as silicon-based inorganic insulator, and in the present embodiment, includes a SiON film.

An exemplary quantum cascade laser 11.

The laser structure 13 is made of semiconductor.

Length of the first region 13a (the length taken in the direction of the first axis Ax1) L1: 5 to 100 micrometers.

Length of the second region 13b (the length in the direction of the first axis Ax1) L2: 5 to 50 micrometers.

Depth D2 of the difference in level 13d: 20 to 30 micrometers.

Thickness of the semiconductor in the second region 13b (the distance from the back face of the semiconductor substrate to the upper face of the semiconductor mesa): 80 micrometers or more.

High-specific resistance region 15: $SiO_2$, SiN, or SiON with a thickness of 200 to 400 nanometers.

Depth D1 of the small step 15d: 200 to 400 nanometers.

Dielectric film 19: alumina or aluminum nitride with a thickness of 100 to 300 nanometers.

Metallic reflective film 21: gold with a thickness of 50 to 300 nanometers.

In the present embodiment, the dielectric film 19 and the reflective metal film 21 form an end face reflection film 20. However, the end face reflection film 20 is not limited to a combination of these two materials.

Core layer 25a: superlattice arranged to generate quantum cascade, such as AlInAs/GaInAs.

Upper semiconductor layer 25b: n-type InP (the cladding layer 25e) and n-type InGaAs (the diffraction grating layer 25f).

Lower semiconductor region 25c: n-type InP (cladding layer).

Contact layer 25d: n-type InGaAs.

Semiconductor substrate 23: n-type InP.

Embedding region 27: undoped and/or semi-insulating III-V compound semiconductor, such as Fe doped InP.

Cavity length: 1 to 3 mm.

Metal layer 17: AuGeNi/Ti/Pt/Au serving as back electrode.

Passivation film 31: $SiO_2$, SiN, or SiON.

Ohmic electrode 33: Ti/Pt/Au.

Thick electrode 35: plated Au.

Referring to FIG. 1, a light emitting device 41 is shown. The light emitting device 41 includes a quantum cascade laser 11, a support 43, and a solder 45. The quantum cascade laser 11 is fixed with the solder 45 to the electrode layer 43b that the support 43 has on the insulating base 43a thereof. The solder 45 is bonded to the metal layer 17 of the third region 13c, and is separated from both the semiconductor of the second region 13b and the fragment DP1 formed on the high-specific resistance region 15 on the first region 13a, in view of the first and second regions 13a and 13b, which the difference in level 13d separates from the third region 13c. This separation can make an electrical potential on the reflective metal film 21 independent of that of the electrode layer 43b on the insulating base 43a. In the present embodiment, the solder 45 may include AuSn.

In the light emitting device 41, the quantum cascade laser 11 provides the first end face E1F with the dielectric film 19 and the reflective metal film 21. The order of process steps for forming the dielectric film 19 and the reflective metal film 21 allows the dielectric film 19 to be under the reflective metal film 21. Inventor's findings reveal that deposited material for the dielectric film 19 is formed on the first end face E1F and is produced on the high-specific resistance region 15 on the first region 13a from a part of the flux which strays from the first end face to fly along the upper and lower sides of the laser bar of the arrangement of the laser structures 13, and that similarly, deposited material for the metal reflective film 21 is formed on the end face of the laser structures and is produced on the high-specific resistance region from a part of the flux which strays from the first end face to fly along the upper and lower faces of the laser bar. The inventor's observations reveal that the deposited material for the dielectric film 19 is formed on the high-specific resistance region and is made thin thereon than the dielectric film 19 on the end face of the laser bar (the first end face E1F of the laser structure 13). The high-specific resistance region 15 on the laser structure 13 can separate the semiconductor of the laser structure 13 from the metal reflective film 21 on the dielectric film 19. The difference in level 13d makes it possible to space the metal layer 17 from the reflective metal film 21 the high-specific resistance region 15.

With reference to FIGS. 2A to 10D, a description will be given of major steps in the method for fabricating a quantum cascade laser according to the embodiment. For easy understanding, where possible, reference numerals in the above description with reference to FIG. 1 will be used in the following description.

Figure 2A:
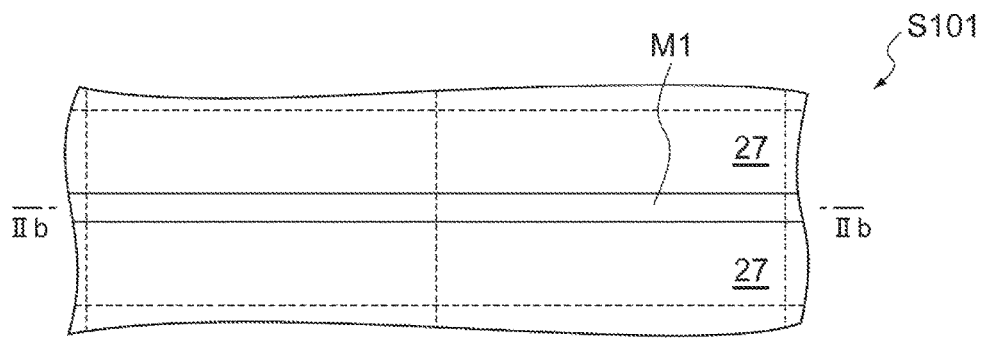
FIG. 2A is a plan view showing a major step in a method for fabricating a quantum cascade laser according to an embodiment.
Figure 2B:
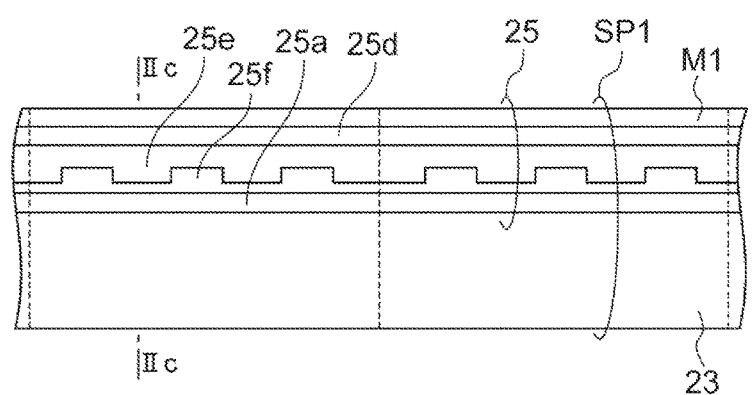
FIG. 2B is a cross sectional view taken along IIb-IIb line in FIG. 2A.
Figure 2C:
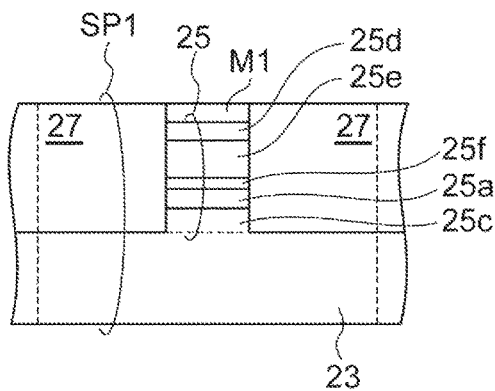
FIG. 2C is a cross sectional view taken along IIc-IIc line in FIG. 2B.

Step S101 will be described with reference to FIGS. 2A, 2B and 2C. FIG. 2A is a plan view showing a major step in the method. FIG. 2B is a cross sectional view taken along line IIb-IIb shown in FIG. 2A. FIG. 2C is a cross sectional view taken along line IIc-IIc shown in FIG. 2B. Step S101 prepares a semiconductor product SP1. The semiconductor product SP1 includes a semiconductor substrate 23, a semiconductor mesa 25 disposed on the semiconductor substrate 23, and an embedding region 27 embedding the semiconductor mesa 25. The epitaxial substrate including the semiconductor substrate 23 and the semiconductor region for the core layer 25a, the diffraction grating layer 25f, the cladding layer 25e, and the contact layer 25d is etched with a first mask M1 of an inorganic insulating film (e.g., SiN) to form the semiconductor mesa 25. After forming the semiconductor mesa 25, the embedding region 27 is formed by selectively growing a high resistance semiconductor with the first mask M1. After the selective growth, the first mask M1 is removed.

Specifically, an n-type lower cladding layer (n-InP), a core layer (a QCL active layer) and a diffraction grating layer (InGaAs) are epitaxially grown on an n-type InP substrate. The diffraction grating layer is processed by photolithography and etching to form a diffraction grating, and an n-type upper cladding layer (n-InP) and an n-type contact layer (n-InGaAs) are epitaxially grown on the diffraction grating layer to form the above semiconductor region. A strip-shaped SiN mask is formed on the contact layer by CVD and photolithography. The above semiconductor region is processed, specifically, dry etched with an SiN mask defining the mesa from the contact layer to a depth of the InP substrate. On the InP substrate, a semiconductor embedding layer (of Fe—InP) is epitaxially grown with the SiN mask. The Fe—InP thus grown has a thickness as high as the upper face of the SiN mask on the mesa. Removal of the SiN mas follows this growth.

Figure 3A:
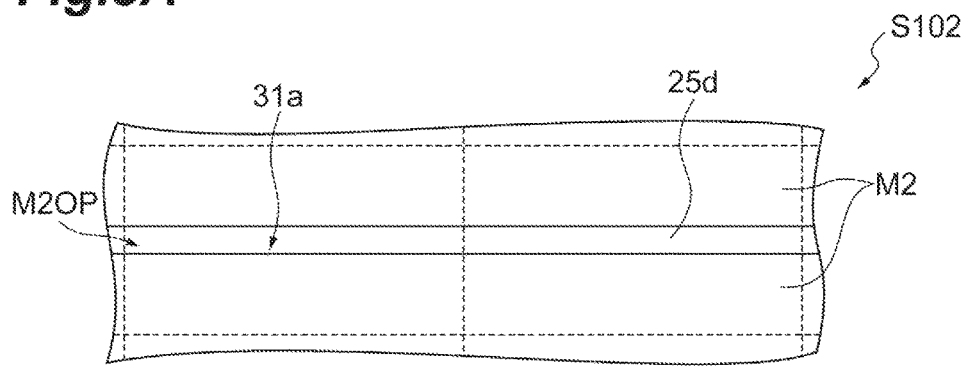
FIG. 3A is a plan view showing a major step in the method according to an embodiment.
Figure 3B:
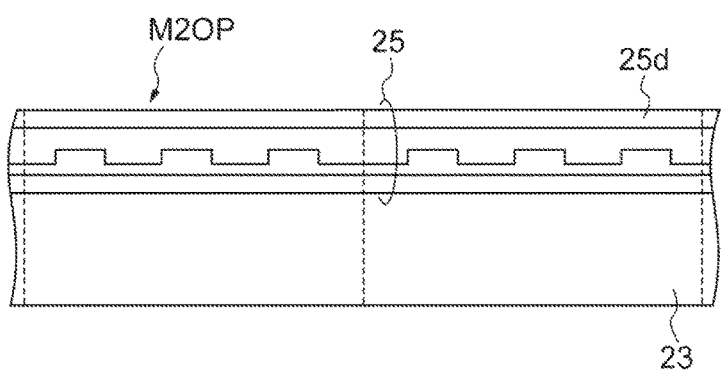
FIG. 3B is a cross sectional view taken along IIIb-IIIb line in FIG. 3A.
Figure 3C:
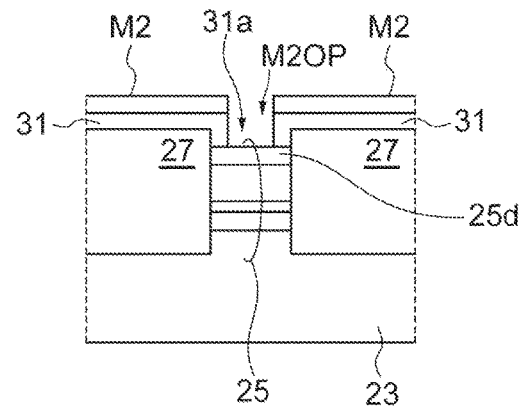
FIG. 3C is a cross sectional view taken along IIIc-IIIc line in FIG. 3B.

Step S102 will be described with reference to FIGS. 3A to 3C. FIG. 3A is a plan view showing a major step in the method according to the present embodiment. FIG. 3B is a cross sectional view taken along the line IIIb-IIIb shown in FIG. 3A. FIG. 3C is a cross sectional view taken along line IIIc-IIIc shown in FIG. 3B. In step S102, a passivation film 31 is formed. A protective film is grown for the passivation film 31. The second mask M2 is formed on the protective film by photolithography and etching. The second mask M2 has a strip-shaped opening M2OP, and the opening M2OP extends on the semiconductor mesa 25. The protective film is etched with the second mask M2 to form a passivation film 31 having an opening 31a. The upper face (the contact layer 25d) of the semiconductor mesa 25 appears at the opening 31a of the passivation film 31.

Specifically, an SiON film (with a thickness of 300 nm) is grown by CVD on the semiconductor mesa 25 and the embedding region 27 formed on the wafer. The SiON film is processed by photolithography and dry etching to form a strip-shaped opening therein. The upper face of InGaAs of the contact layer appears at this opening.

Figure 4A:
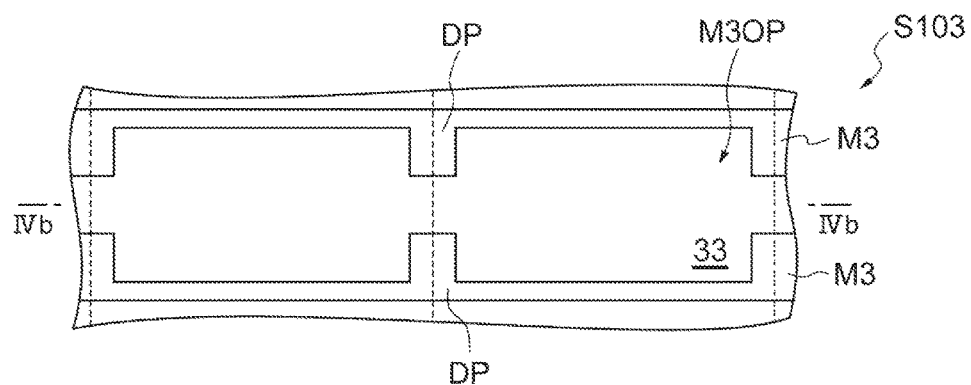
FIG. 4A is a plan view showing a major step in the method according to the embodiment.
Figure 4B:
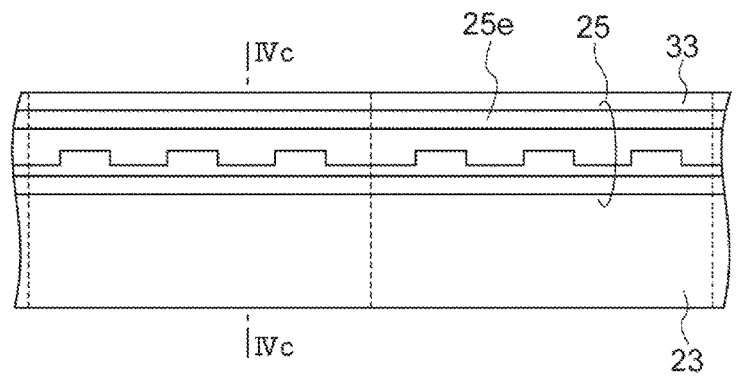
FIG. 4B is a cross sectional view taken along IVb-IVb line in FIG. 4A.
Figure 4C:
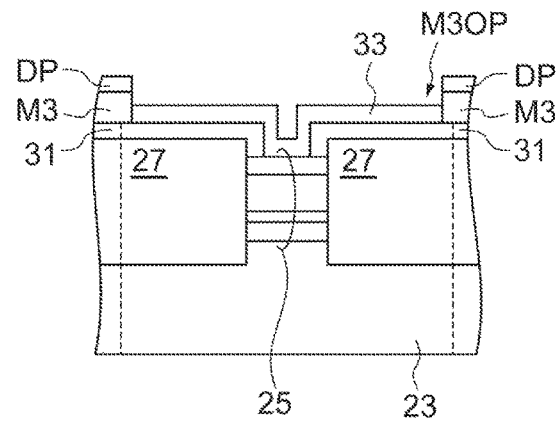
FIG. 4C is a cross sectional view taken along IVc-IVc line in FIG. 4B.

Step S103 will be described with reference to FIGS. 4A to 4C. FIG. 4A is a plan view showing a major step in the method according to the present embodiment. FIG. 4B is a cross sectional view taken along line IVb-IVb shown in FIG. 4A. FIG. 4C is a cross sectional view taken along line IVc-Vc shown in FIG. 4B. In step S103, an ohmic electrode 33 is formed. Specifically, a third mask M3 for lift-off is formed on the passivation film 31. The third mask M3 has an opening M3OP on the semiconductor mesa 25. After the third mask M3 is formed, a metal film for the ohmic electrode 33 is deposited thereon. In this depositing process, deposited material DP for a metal film is grown in the opening M3OP of the third mask M3 and on the third mask M3. After the depositing process, the removal of the third mask M3 forms a patterned metal layer for the ohmic electrode 33.

Specifically, a resist mask is formed for lift-off on the wafer by photolithography. The lift-off mask can form a pattern defining the shape of the plated electrode, which is formed by a later process. After the lift-off mask is formed, a Ti/Pt/Au film is formed by vapor deposition, and removing the lift-off mask can eliminate the deposited material DP along with the lift off mask to leave a patterned Ti/Pt/Au film for an ohmic electrode. The ohmic electrode of Ti/Pt/Au is formed on the contact layer and the SiON film, and is in contact with the contact layer.

Figure 5A:
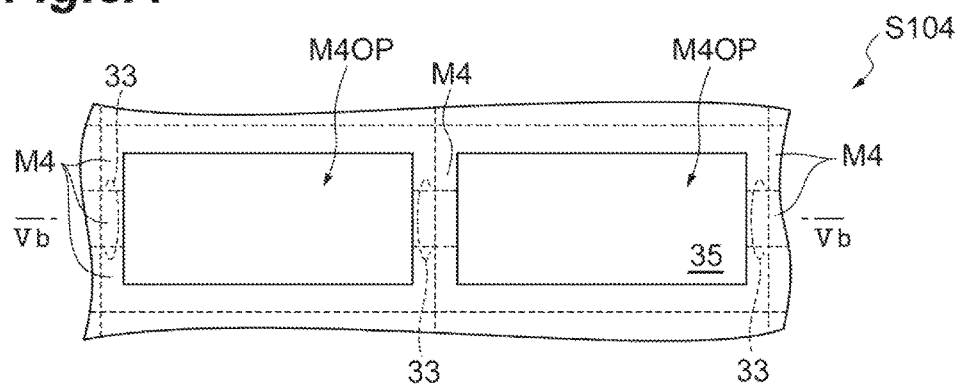
FIG. 5A is a plan view showing a major step in the method according to the embodiment.
Figure 5B:
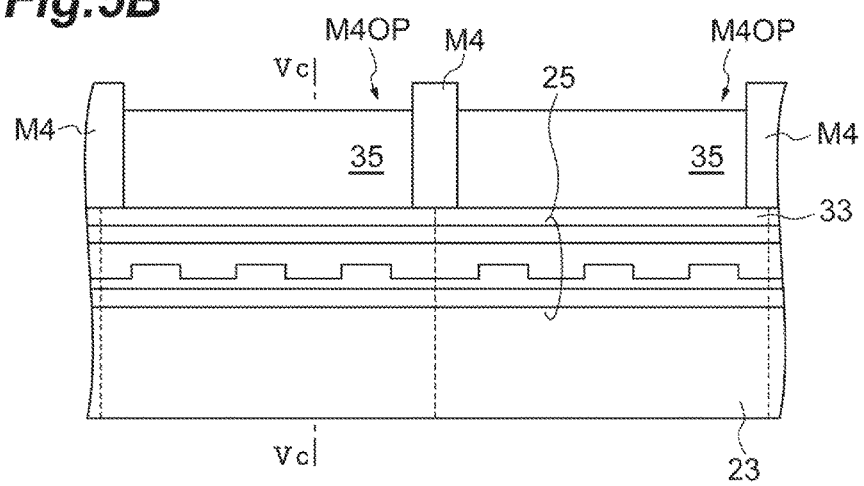
FIG. 5B is a cross sectional view taken along Vb-Vb line in FIG. 5A.
Figure 5C:
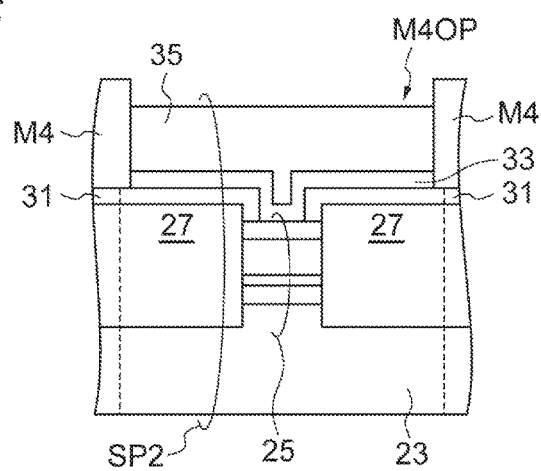
FIG. 5C is a cross sectional view taken along Vc-Vc line in FIG. 5B.

Step S104 will be described with reference to FIGS. 5A to 5C. FIG. 5A is a plan view showing a major step in the method according to the present embodiment. FIG. 5B is a cross sectional view taken along line Vb-Vb shown in FIG. 5A. FIG. 5C is a cross sectional view taken along line Vc-Vc shown in FIG. 5B. In step S104, specifically, the thick film electrode 35 is formed by plating. A fourth mask M4 for lift-off is formed on the passivation film 31 and the ohmic electrode 33. The fourth mask M4 has an opening M4OP on the ohmic electrode 33. Metal for the thick film electrode 35 is plated thereon with the fourth mask M4. In the plating process, plating is made to form plated metal in the opening M4OP of the fourth mask M4 on the ohmic electrode 33. After the plating process, the fourth mask M4 is removed to obtain a patterned thick metal film for the thick electrode 35.

Specifically, a plating mask of resist is formed on the wafer by photolithography. This plating mask has, for example, an opening on the ohmic electrode 33. Gold (Au) plating is made with the plating mask. The plating process is followed by removal of the plating mask, thereby obtaining a substrate product SP2.

Figure 6A:
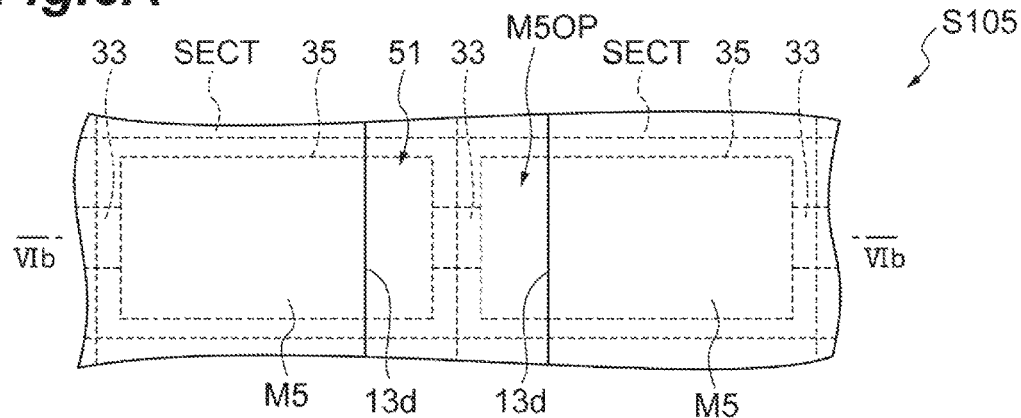
FIG. 6A is a plan view showing a major step in the method according to the embodiment.
Figure 6B:
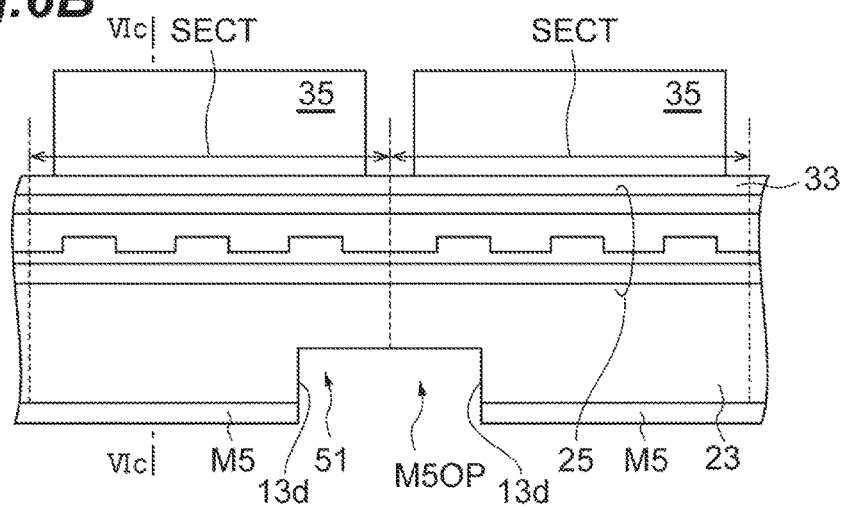
FIG. 6B is a cross sectional view taken along VIb-VIb line in FIG. 6A.
Figure 6C:
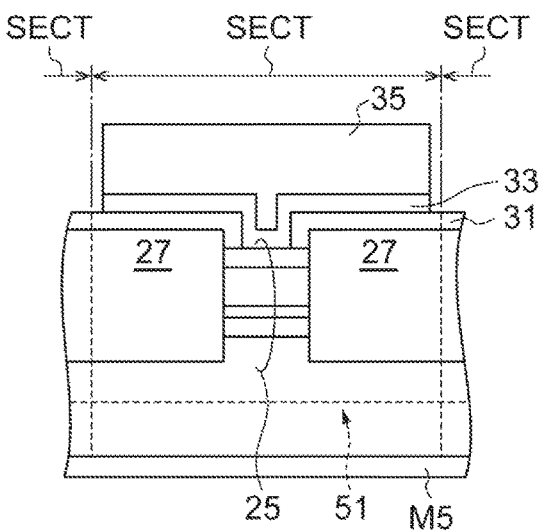
FIG. 6C is a cross sectional view taken along VIc-VIc line in FIG. 6B.

Step S105 will be described with reference to FIGS. 6A to 6C. FIG. 6A is a bottom view showing a major step in the method according to the embodiment. FIG. 6B is a cross sectional view taken along line VIb-VIb shown in FIG. 6A. FIG. 6C is a cross sectional view taken along line VIc-VIc shown in FIG. 6B. In step S105, a groove 51 is formed which defines the difference in level 13d in the laser structure 13. A fifth mask M5 is formed on the back face of the substrate product SP2. If necessary, the back face of the substrate product SP2 is polished to reduce the thickness of the substrate product SP2. The fifth mask M5 may be formed on the polished back face, and has an opening M5OP defining the groove 51, which forms the difference in level 13d in the laser structure 13. The semiconductor substrate 23 of the substrate product SP2 is etched with the fifth mask M5 of an inorganic insulating film (e.g., SiN) to form the groove 51. The groove 51 extends across boundaries between the device sections SECT for the quantum cascade laser and in a direction intersecting the direction in which the ohmic electrode 33 extends in each device section. After etching, the fifth mask M5 is removed.

Specifically, the wafer with the polished backside has a reduced thickness of 350 to 110 micrometers. An insulating mask made of a SiN film is formed on the polished back face by CVD and photolithography. The insulating mask has strip-shaped openings and strip-shaped patterns, and each of the strip-shaped openings extends along a line where the end face for an optical cavity is to be formed and which is on the boundary between the adjoining device sections. The strip-shaped patterns cover inner areas between the adjoining strip-shaped openings, of the device sections. The wafer is dry etched with the insulating mask to form recesses on the back face thereof, and the recesses have a depth of 20 to 30 micrometers. The product thus formed is provided with the residual thickness of 80 micrometers or more, which allows the product to have a mechanical strength, in the neighbor of the boundaries between the device sections. After the etching, the insulating mask is removed. There processes bring the back face of the InP substrate an arrangement of the recesses, such as grooves. The grooves each have a width of, for example, 100 micrometers.

Figure 7A:
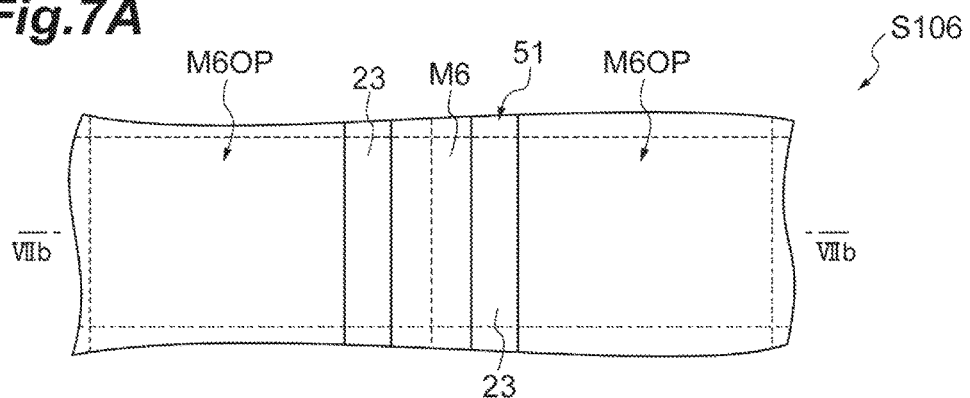
FIG. 7A is a plan view showing a major step in the method according to the embodiment.
Figure 7B:
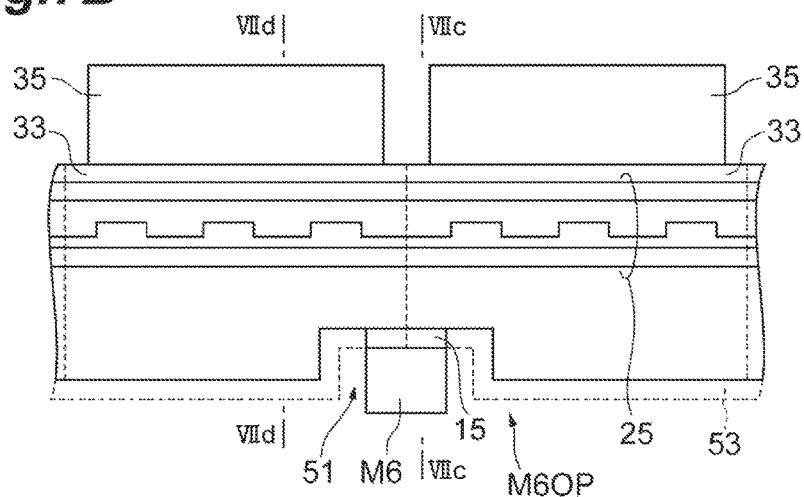
FIG. 7B is a cross sectional view taken along VIIb-VIIb line in FIG. 7A.
Figure 7C:
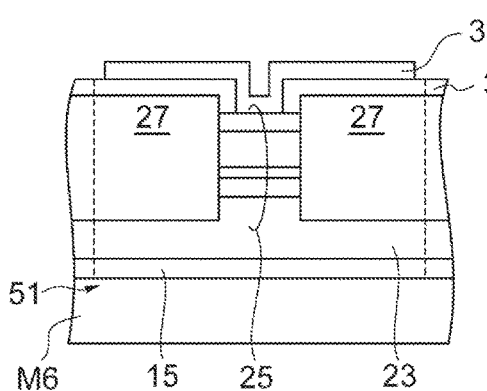
FIG. 7C is a cross sectional view taken along VIIc-VIIc line in FIG. 7B.
Figure 7D:
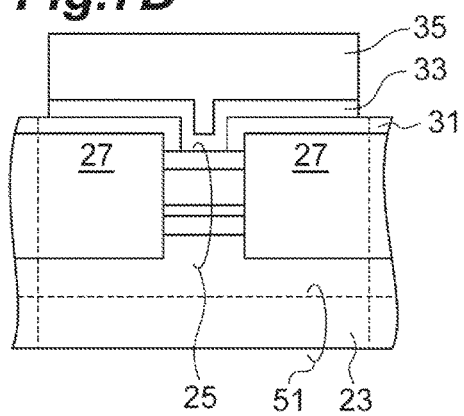
FIG. 7D is a cross sectional view taken along VIId-VIId line in FIG. 7B.

Step S106 will be described with reference to FIGS. 7A to 7D. FIG. 7A is a bottom view showing a major step in the method according to the example. FIG. 7B is a cross sectional view taken along line VIIb-VIIb shown in FIG. 7A. FIG. 7C is a cross sectional view taken along line VIIc-VIIc shown in FIG. 7B. FIG. 7D is a cross sectional view taken along line VIId-VIId shown in FIG. 7B. In step S106, an insulating film 53 is formed for the high-specific resistance region 15. A sixth mask M6 is formed by photolithography and etching. The sixth mask M6 has strip-shaped patterns extending in the grooves 51 and strip-shaped openings M6OP defining the stripe patterns. The strip-shaped patterns each extend along a boundary between the device sections, and the end face for an optical cavity will be formed at the boundary in a later process. Each opening M6OP is located on the edge (the difference in level 13d) of the groove 51. The insulating film 53 is etched with the sixth mask M6 to form the high-specific resistance region 15. This etching removes the insulating film 53 covering an edge (the terrace 13d) of the groove 51 to expose the edge. The high-specific resistance region 15 extends on the bottom face of the groove 51 along the boundary between the device sections.

Specifically, an SiON film is deposited by CVD on the entire back face of the wafer, and has a thickness of 300 nm. A resist mask is formed on the SiON film. The resist mask covers a strip-shaped area on the boundary line between the device sections. The SiON film is dry-etched with the resist mask to form a strip-shaped SiON pattern on the above area. The strip-shaped SiON film has a width of 50 micrometers.

Figure 8A:
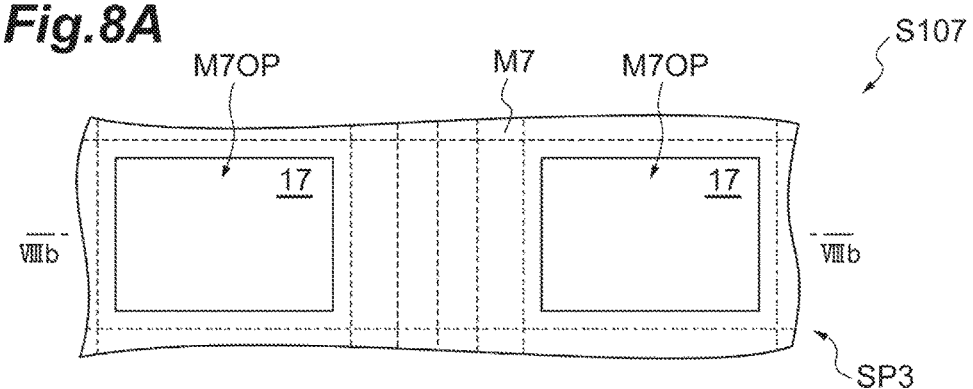
FIG. 8A is a plan view showing a major step in the method according to the embodiment.
Figure 8B:
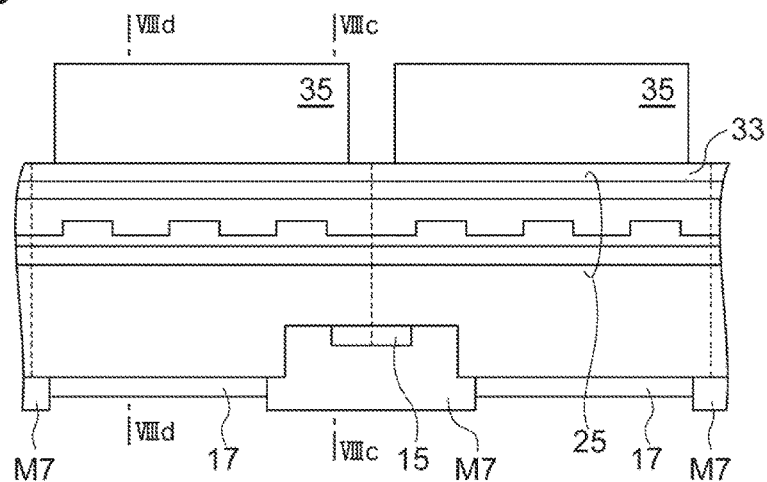
FIG. 8B is a cross sectional view taken along VIIIb-VIIIb line in FIG. 8A.
Figure 8C:
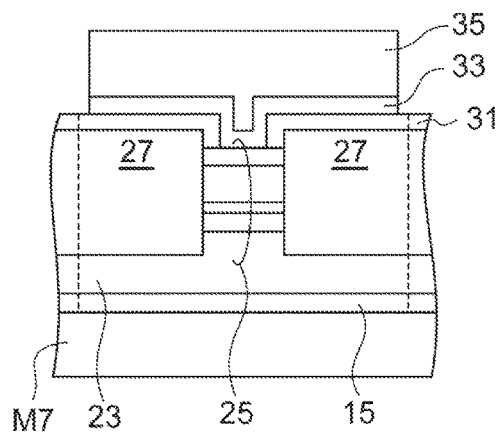
FIG. 8C is a cross sectional view taken along VIIIc-VIIIc line in FIG. 8B.
Figure 8D:
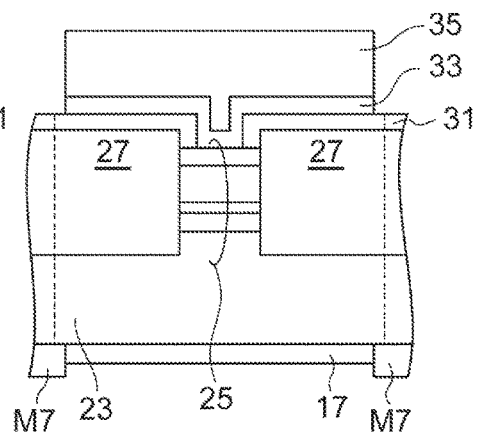
FIG. 8D is a cross sectional view taken along VIIId-VIIId line in FIG. 8B.

Step S107 will be described with reference to FIGS. 8A to 8D. FIG. 8A is a bottom view showing a major step in the method according to the example. FIG. 7B is a cross sectional view taken along line VIIIb-IIIb shown in FIG. 8A. FIG. 8C is a cross sectional view taken along the line VIIIc-VIIIc shown in FIG. 8B. FIG. 8D is a cross sectional view taken along line VIIId-VIIId shown in FIG. 8B. In step S107, a metal layer 17 is formed for the backside electrode. A seventh mask M7 is formed for lift-off on the back face of the semiconductor substrate 23. The seventh mask M7 has an opening M7OP on the metal layer 17. After forming the seventh mask M7, a film of AuGeNi/Ti/Pt/Au is formed by vapor deposition and the seventh mask M7 is removed for lifting-off along with deposited material on the seventh mask M7 to form a metal layer 17. The metal layer 17 of AuGeNi/Ti/Pt/TiAu is electrically connected to the semiconductor substrate 23. The metal layer 17 of Ti/Pt/TiAu is apart from the groove 51. The formation of the backside metal produces a product SP3.

Specifically, a backside mask of resist is formed on the back face of the wafer by photolithography. The backside mask has an opening, which is distant from the groove 51 and the high-specific resistance region 15, on the back face of the semiconductor substrate 23. AuGeNi/Au/TiAu is formed by vapor deposition of metal and lifted off with the backside mask to form the back electrode.

Figure 9A:
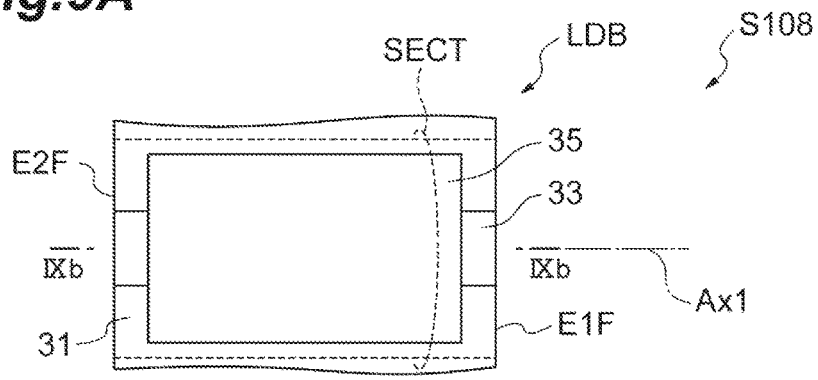
FIG. 9A is a plan view showing a major step in the method according to the embodiment.
Figure 9B:
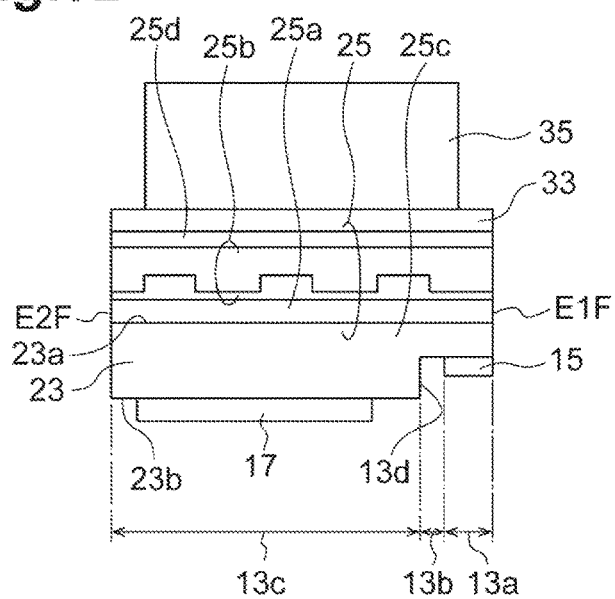
FIG. 9B is a cross sectional view taken along IXb-IXb line in FIG. 9A.
Figure 9C:
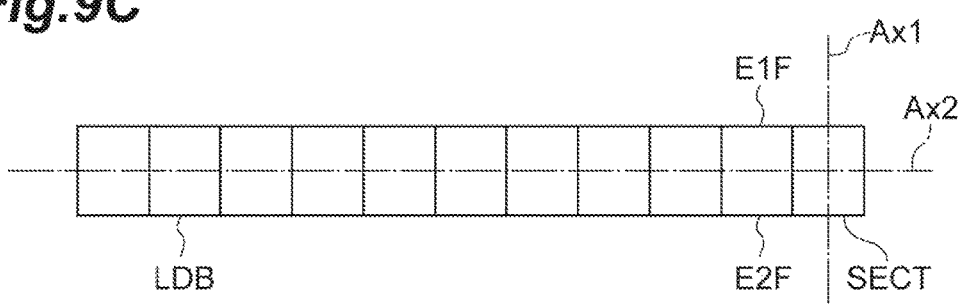
FIG. 9C is a plan view showing a laser bar in a major step in the method according to the embodiment.

Step S108 will be described with reference to FIGS. 9A to 9C. FIG. 9A is a plan view showing a major step in the method according to the example. FIG. 9B is a cross sectional view taken along line IXb-IXb shown in FIG. 9A. FIG. 9C is a plan view showing the laser bar. In step S108, a laser bar LDB is prepared. The product SP3 is separated along cleavage lines into laser bars LDB. This separation allows each laser bar LDB to have the first and second end faces E1F and E2F for the quantum cascade laser 11. In the present embodiment, the first and second end faces E1F and E2F each has a cleavage facet. The laser bar LDB includes an array of device sections SECT for the quantum cascade laser 11. These device sections SECT are arranged in the direction of the second axis Ax2. As shown in FIG. 1, each device section SECT includes the laser structure 13, the high-specific resistance region 15, and the metal layer 17. The laser structure 13 and the high-specific resistance region 15 extend continuously across the device sections SECT. The laser structure 13 includes the first region 13a, the second region 13b and the third region 13c, which are sequentially arranged in the direction of the first axis Ax1. The first region 13a includes the first end face E1F, and the third region 13c includes the second end face E2F. The laser structure 13 has the difference in level 13d at the boundary between the second and third regions 13b and 13c. The laser structure 13 is provided with the terrace 13d on the back face 23b (the face opposite to the principal surface 23a) of the semiconductor substrate 23, and the terrace 13d continuously extends through the device sections SECT in the direction of the second axis Ax2. The high-specific resistance region 15 is disposed on the first region 13a of the laser structure 13. The metal layer 17 is disposed on the third region 13c, and makes contact with the back face of the third region 13c. The laser structure 13 includes the semiconductor substrate 23 and the semiconductor mesa 25, and the semiconductor mesa 25 is mounted on the principal surface 23a of the semiconductor substrate 23. The semiconductor mesa 25 includes the core layer 25a, and specifically, further includes the upper semiconductor layer 25b, the lower semiconductor region 25c, and the contact layer 25d. The semiconductor mesa 25 extends in the direction of the first axis Ax1. In the present embodiment, the laser structure 13 further includes the embedding region 27.

Figure 10A:
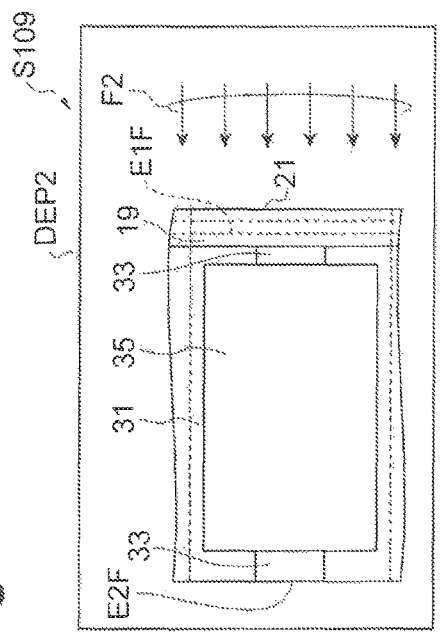
FIG. 10A is a top view showing a major step in the method according to the embodiment.
Figure 10B:
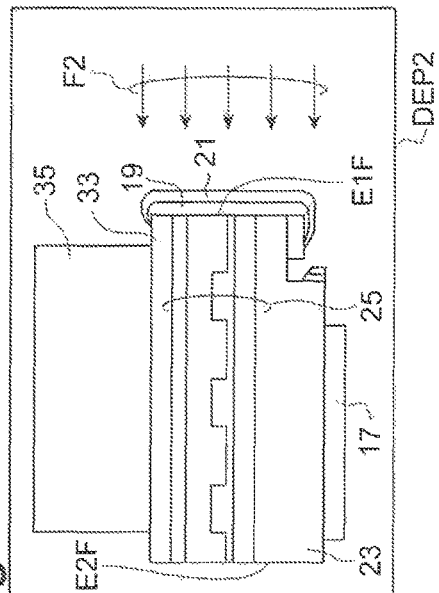
FIG. 10B is a schematic side view showing the major step shown in FIG. 10A.
Figure 10C:
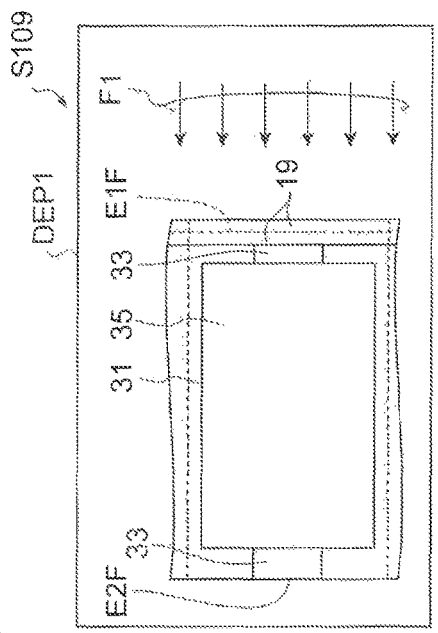
FIG. 10C is a top view showing a major step in the method according to the embodiment.
Figure 10D:
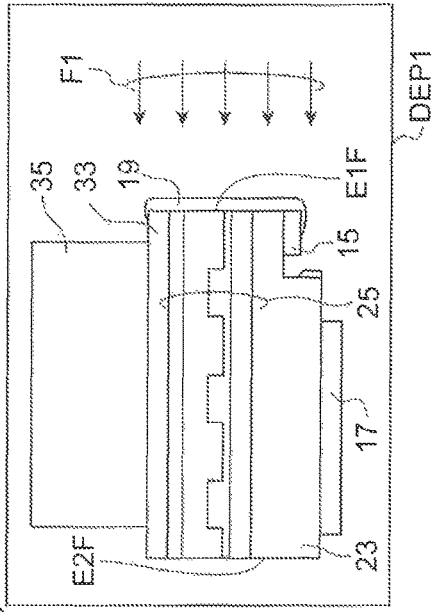
FIG. 10D is a schematic side view showing the major step shown in FIG. 10C.

Step S109 will be described with reference to FIGS. 10A to 10D. In step S109, the dielectric film 19 and the reflective metal film 21 are formed in order on the first end face E1F of the laser bar LDB thus prepared. FIGS. 10A and 10B are schematic views each showing a major step in the method according to the example. As shown in FIGS. 10A and 10B, the dielectric film 19 is formed on the first end face E1F of the laser bar LDB. In the present embodiment, the dielectric film 19 is deposited with a deposition apparatus DEP1. The deposition apparatus DEP1 supplies raw material flux F1 to the first end face E1F of the laser bar LDB. The flux F1 misses the first end face to fly along the upper and lower sides of the laser bar LDB, so that material for the dielectric film 19 is formed on the upper ohmic electrode 33 and deposited on the high-specific resistance region 15 and the side of the terrace 13d on the lower side of the laser bar. The deposited material for the dielectric film 19 terminates at the edge of the high-specific resistance region 15. FIGS. 10C and 10D are schematic views each showing a major step in the method according to the present embodiment. Thereafter, as shown in FIGS. 10C and 10D, the reflective metal film 21 is formed on the dielectric film 19 on the first end face E1F of the laser bar LDB. In the present embodiment, the reflective metal film 21 is deposited in a deposition apparatus DEP2. The deposition apparatus DEP2 supplies raw material flux F2 to the first end face E1F of the laser bar LDB. The flux F2 also misses the first end face to fly along the upper and lower sides of the laser bar LDB, so that deposited material for the reflective metal film 21 is formed on the upper ohmic electrode 33 and on the high-specific resistance region 15 and the side of the terrace 13d on the lower side of the laser bar. The deposited material for the reflective metal film 21 terminates at the edge of the high-specific resistance region 15.

After forming the dielectric film 19 and the reflective metal film 21 in order on the first end face E1F of the laser bar LDB, the laser bar LDB is separated by breakage into semiconductor chips of a quantum cascade laser 11. These steps bring the quantum cascade laser 11 to completion.

Figure 11A:
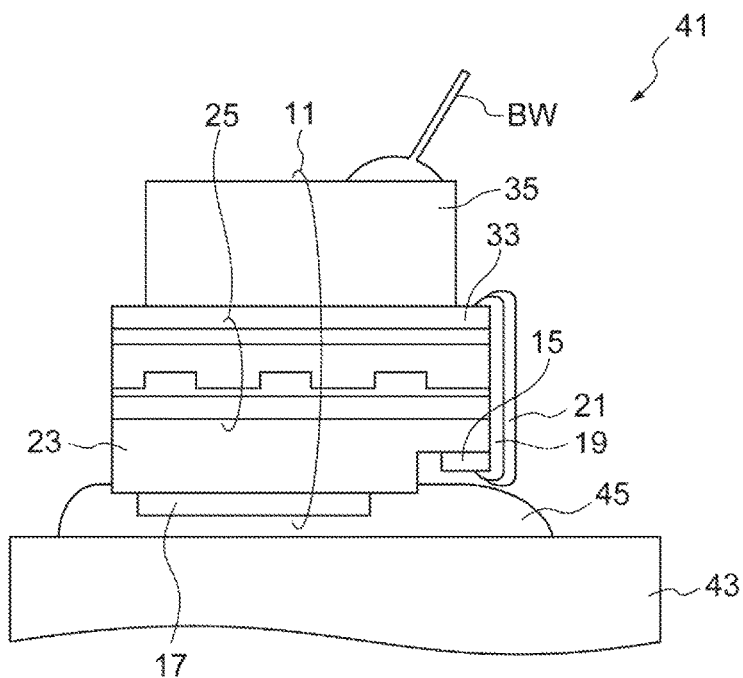
FIG. 11A is a schematic view showing a step for die-bonding the quantum cascade laser in the method according to the embodiment.

The die bonding process will be described with reference to FIGS. 11A and 11B. FIG. 11A is a schematic view showing a die bonding step in the method according to the embodiment. As described above with reference to FIG. 1, in the die bonding step, the quantum cascade laser 11 according to the present embodiment can prevent the dielectric film 19 and the reflective metal film 21 on the first end face E1F from the solder material 45. Prior to the die bonding step, the above steps bring the quantum cascade laser 11 to completion. The quantum cascade laser 11 is die-bonded to a supporting base with a conductive adhesive, such as a solder. Further, the quantum cascade laser 11 on the support is connected to an interconnect for wire-bonding.

Figure 11B:
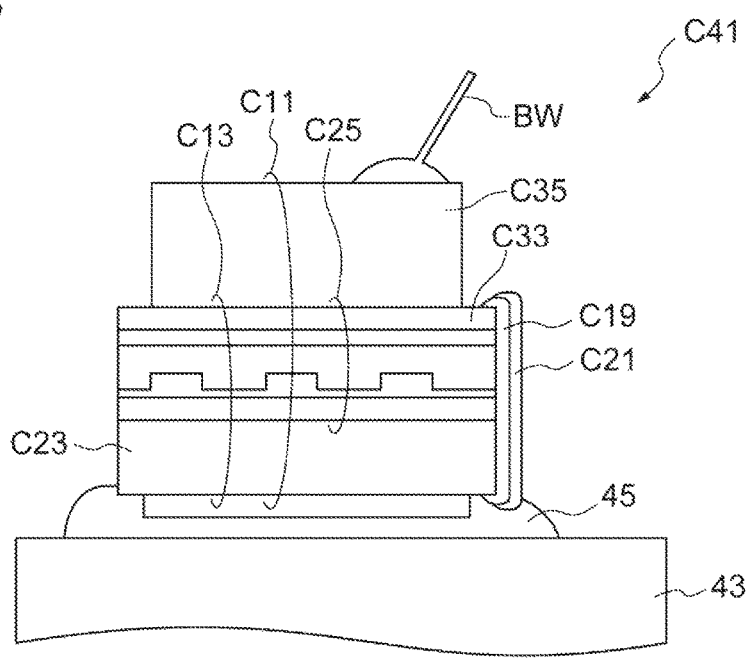
FIG. 11B is a schematic view showing a step for die-bonding a quantum cascade laser different from the quantum cascade laser in the method according to the embodiment.

FIG. 11B is a schematic view showing a step for die-bonding a quantum cascade laser having a structure with a reflection film, which is different from the quantum cascade laser according to the embodiment, on the end face thereof. The quantum cascade laser C11 shown in FIG. 11B has a dielectric film C19 and a reflective metal film C21 on the end face of the laser structure C13. The semiconductor substrate C23 has the same thickness on the entire laser, so that the dielectric film C19 and the metal reflective film C21 extend on the back face of the semiconductor substrate C23 to reach the metal layer C17 on the back face. The quantum cascade laser C11 is die-bonded, and the dielectric film C19 and the metal reflective film C21 extend from the end face of the semiconductor substrate C23 to the lower face to be in contact with the solder material. The fluxes for the dielectric film C19 and the reflective metal film C21 also miss the end face of the semiconductor substrate C23 to fly along the upper face of the laser structure C13 and deposit on the ohmic electrode C33. The reflective metal film C21 on the dielectric film C19 of a small thickness causes a short circuit on each of the upper and lower faces of the laser structure C13.

The method of fabricating the quantum cascade laser 11 provides the dielectric film 19 and the reflective metal film 21 on the first end face E1F of the laser bar LDB. Raw material flux for the dielectric film 19 is deposited on the first end face E1F of the laser bar LDB to form the film, and strays from the first end face to fly along the upper and lower faces of the laser bar LDB to deposit on the high resistance region 15 on the first region 13a. Similarly, raw material flux for the reflective metal film 21 is deposited on the first end face E1F of the laser bar LDB, and strays from the first end face to fly along the first region 13a to deposit on the high-specific resistance region 15 on the first region 13a. The order of steps for forming the dielectric film 19 and the reflective metal film 21 provides the reflective metal film 21 with the dielectric film 19 acting as a basal layer. The inventor's observations show that the deposited material for the dielectric film 19 on the high-specific resistance region 15 on the first region 13a has a thickness smaller than that of the dielectric film 19 on the first end face E1F of the laser bar LDB. The high-specific resistance region 15 of the laser bar LDB, however, ensures that the reflective metal film 21 on the dielectric film 19 is spaced from the semiconductor of the laser bar LDB. The terrace 13d of the laser bar LDB can separate the reflective metal film 21 on the high-specific resistance region 15 from the metal layer 17.

As described above, the present embodiment can provide a quantum cascade laser having a structure capable of avoiding a short circuit; a light emitting device including the quantum cascade laser; and a method of fabricating the semiconductor laser.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising:
   a laser structure including a first region, a second region, and a third region, the first region having an end face;
   a high-specific resistance region disposed on the first region and the second region;
   a metal layer disposed on the third region;
   a dielectric film disposed on the end face and the high-specific resistance region; and
   a reflective metal film disposed on the dielectric film, the end face and the high-specific resistance region,
   the first region, the second region, and the third region being arranged in order in a direction of an axis,
   the laser structure having a terrace with a difference in level disposed on a boundary between the second region and the third region, and
   the laser structure including a semiconductor mesa and a conductive base, the semiconductor mesa having a core layer, and the conductive base mounting the semiconductor mesa, and the high-specific resistance region having a specific resistance larger than that of the conductive base.

2. The quantum cascade laser according to claim 1, wherein
   the high-specific resistance region has the inorganic insulating film on the first region of the laser structure,
   the high-specific resistance region has an edge at the boundary between the second region and the third region, and
   the edge of the high-specific resistance region terminates the reflective metal film.

3. The quantum cascade laser according to claim 2, wherein the inorganic insulating film includes a silicon-based inorganic insulator.

4. The quantum cascade laser according to claim 3, wherein the laser structure includes an embedding region embedding the semiconductor mesa.

5. A light emitting apparatus comprising:
   a quantum cascade laser including
      a laser structure having a first region, a second region, and a third region, the first region having an end face;
      a high-specific resistance region disposed on the first region and the second region;
      a metal layer disposed on the third region;
      a dielectric film disposed on the end face and the high-specific resistance region; and
      a reflective metal film disposed on the dielectric film, the end face and the high-specific resistance region;
   a supporting base mounting the quantum cascade laser; and
   a solder material making contact with the metal layer of the quantum cascade laser to fix the quantum cascade laser to the supporting base,
   the first region, the second region, and the third region being arranged in order in a direction of an axis,
   the laser structure having a terrace with a difference in level disposed on a boundary between the second region and the third region, and
   the laser structure including a semiconductor mesa and a conductive base, the semiconductor mesa having a core layer, and the conductive base mounting the semiconductor mesa, and the high-specific resistance region having a specific resistance larger than that of the conductive base.

6. A method for fabricating a quantum cascade laser comprising:
   preparing a laser bar having an arrangement of device sections;
   supplying a flux of raw material for a dielectric insulator to a first end face of the laser bar to deposit dielectric insulator thereon; and
   after supplying the flux of the dielectric insulator, supplying a flux of raw material for a metal reflective film to the first end face of the laser bar to deposit the metal reflective film thereon,
   the laser bar including a laser structure and a high-specific resistance region, the laser structure having a first region, a second region, a third region, and a terrace, the first region having the first end face, and the high-specific resistance region being disposed on the first region,
   the first region, the second region, and the third region being arranged in order in a direction of a first axis and extending in a direction of a second axis intersecting that of the first axis, and
   the high-specific resistance region extending in the direction of the second axis, and the terrace having a difference in level extending on a boundary between the second region and the third region in the direction of the second axis.

* * * * *